(12) United States Patent
Liu

(10) Patent No.: US 9,245,901 B1
(45) Date of Patent: Jan. 26, 2016

(54) MEMORY DEVICE AND METHOD FOR FABRICATING THE SAME

(71) Applicant: MACRONIX International Co., Ltd., Hsinchu (TW)

(72) Inventor: Kuang-Wen Liu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/465,598

(22) Filed: Aug. 21, 2014

(51) Int. Cl.
| | |
|---|---|
| *H01L 33/00* | (2010.01) |
| *H01L 27/115* | (2006.01) |
| *H01L 29/792* | (2006.01) |
| *H01L 29/423* | (2006.01) |
| *H01L 29/06* | (2006.01) |
| *H01L 29/66* | (2006.01) |
| *H01L 21/762* | (2006.01) |
| *H01L 21/28* | (2006.01) |
| *H01L 21/311* | (2006.01) |
| *H01L 29/51* | (2006.01) |
| *H01L 29/49* | (2006.01) |
| *H01L 21/768* | (2006.01) |
| *H01L 23/528* | (2006.01) |

(52) U.S. Cl.
CPC .... *H01L 27/11582* (2013.01); *H01L 21/28282* (2013.01); *H01L 21/31116* (2013.01); *H01L 21/762* (2013.01); *H01L 21/768* (2013.01); *H01L 23/528* (2013.01); *H01L 27/11565* (2013.01); *H01L 27/11568* (2013.01); *H01L 29/0649* (2013.01); *H01L 29/4234* (2013.01); *H01L 29/4925* (2013.01); *H01L 29/513* (2013.01); *H01L 29/518* (2013.01); *H01L 29/66833* (2013.01); *H01L 29/7926* (2013.01)

(58) Field of Classification Search
CPC .................................................. H01L 27/11582
USPC .......................................................... 438/242
See application file for complete search history.

(56) References Cited

U.S. PATENT DOCUMENTS

2002/0033512 A1* 3/2002 Honeycutt et al. ............ 257/410
2004/0115884 A1* 6/2004 Wang ............................ 438/257

* cited by examiner

*Primary Examiner* — Anthony Ho
(74) *Attorney, Agent, or Firm* — J.C. Patents

(57) ABSTRACT

A memory device is provided, which includes a plurality of gate pillar structures and a plurality of dielectric pillars extending alternately arranged along a same direction and embedding in a stack layer so that the stack layer divided into a plurality of stack structures.

9 Claims, 5 Drawing Sheets

MEMORY DEVICE AND METHOD FOR FABRICATING THE SAME

BACKGROUND OF THE INVENTION

1. Field of the Invention

The invention relates to a semiconductor device and a method for fabricating the same, and particularly relates to a memory device and a method for fabricating the same.

2. Description of Related Art

With the continuous development of science and technology, the demands to the storage capability also increases as the electronic products continue to improve. To improve the storage capability, memory devices become smaller in size and have a greater integrality. Thus, the industries now more and more attentively focus on three-dimensional memory devices.

However, as the integrality of three-dimensional memory devices continues to increase, the defects in the fabricating process of vertical gates occur more and more commonly due to a high aspect ratio and stacking of composite films. The defects include bit line channel bending, word line bridging, etc. Therefore, how to develop a memory device having a high integrality and a method for fabricating the same to avoid bit line channel bending and word line bridging has now become an important issue to be touched upon.

SUMMARY OF THE INVENTION

The invention provides a memory device and a method for fabricating the same capable of solving bit line channel bending and word line bridging in a fabricating process of vertical gates.

The invention provides a memory device and a method for fabricating the same applicable to charge trapping memory, non-volatile memory, and embedded memory.

The invention provides a memory device including a plurality of gate pillar structures and a plurality of dielectric pillars extending along a same direction, arranged alternately, and embedded in a stack layer, so that the stack layer is divided into a plurality of stack structures.

According to an embodiment of the invention, the memory device includes a substrate, a plurality of word lines, a plurality of isolation structures, the plurality of stack structures, the plurality of gate pillar structures, and the plurality of dielectric pillars. The substrate has a plurality of first regions and a plurality of second regions, wherein the first regions and the second regions are arranged alternately along a first direction. The word lines are located on the substrate, wherein each of the word lines extends along the first direction and crosses the first regions and the second regions. The isolation structures are located on the substrate and between two adjacent word lines, wherein each of the isolation structures extends along the first direction and crosses the first regions and the second regions. The stack structures are located on the word lines and the isolation structures in the second regions, wherein each of the stack structures extends along a second direction. The gate pillar structures are located in the first regions, wherein each of the gate pillar structures extends along a third direction. Each of the gate pillar structures includes a conductive pillar and a charge storage layer. A bottom of each conductive pillar is electrically connected with the corresponding word line. Each of the charge storage layers is located at a periphery of the corresponding conductive pillar to electrically isolate the corresponding stack structure and the conductive pillar. The first direction is different from the second direction, and is different from the third direction. The plurality of conductive pillars are located on the isolation structures in the first regions. The conductive pillars extend along the third direction, and the conductive pillars and the gate pillar structures are arranged alternately along the second direction to electrically isolate the gate pillar structures and the stack structures.

According to an embodiment of the invention, a shape of sidewalls of the gate pillar structures in two adjacent first regions and the stack structure in the second region between the dielectric pillars includes a sawtoothed shape, or a serpentine shape.

According to an embodiment of the invention, the third direction is perpendicular to the first direction and the second direction, and the first direction is perpendicular to the second direction.

According to an embodiment of the invention, each of the stack structures includes a plurality of insulating layers and a plurality of conductive layers, and the insulating layers and the conductive layers are stacked alternately along the third direction.

According to an embodiment of the invention, a material of the insulating layers includes silicon oxide, silicon nitride, and a combination thereof. A material of the conductive layers includes doped polysilicon, undoped polysilicon, or a combination thereof.

According to an embodiment of the invention, each of the charge storage layers includes an oxide layer, a nitride layer, or a composite layer of an arbitrary combination thereof.

According to an embodiment of the invention, a material of the word lines includes polysilicon, metal silicide, metal, or a combination thereof.

According to an embodiment, the gate pillar structures at two sides of each of the stack structures are formed into a dual gate structure.

The invention provides a method for fabricating a memory device, including steps as follows. A substrate having a plurality of first regions and second regions is provided. The first regions and the second regions are arranged alternately along a first direction. Then, a plurality of word lines are formed on the substrate. Each of the word lines extends along a first direction and crosses the first regions and the second regions. Then, an isolation structure is formed between two adjacent word lines. Each of the isolation structures extends along the first direction, and crosses the first and second regions. The word lines and the isolation structures are alternately arranged along a second direction. A stack layer is formed on the substrate. A plurality of first holes are formed in the stack layer on the word lines in the first regions to expose top surfaces of the word lines. A gate pillar structure is formed in each of the first holes. Each of the gate pillar structures extends along the third direction. Each of the gate pillar structures includes a conductive pillar and a charge storage layer. A bottom of each conductive pillar is electrically connected with the corresponding word line. Each of the charge storage layers is located at a periphery of the corresponding conductive pillar to electrically isolate the corresponding stack layer and the conductive pillar. The first direction is different from the second direction, and is different from the third direction. A plurality of second holes are formed in the stack layer on the isolation structures in the first regions to expose top surfaces of the isolation structures. The second holes and the gate pillar structures are alternately arranged along the second direction. Each of the second holes contacts the gate pillar structure adjacent thereto, such that the stack layer is formed into a plurality of stack structures in the second regions. The stack structures extend along the second direction. A dielectric pillar is formed in each of the second holes. The conductive pillars extend along the third direction, and the conductive pillars and the gate pillar structures are arranged alternately along the second direction to electrically isolate the gate pillar structures and the stack structures.

According to an embodiment of the invention, the step of forming the corresponding gate pillar structure in each of the first holes is as follows. A charge storage material layer is formed on the substrate. The charge storage material layer covers a top surface of the stack layer, sidewalls of the first holes, and top surfaces of the word lines. A part of the charge storage material layer is removed by performing an anisotropic etching process to expose the top surfaces of the stack layer and the word lines, thereby forming a charge storage layer on the side wall of each of the first holes. Then, a conductive pillar is formed in each of the first holes, such that each of the charge storage layers is located at the periphery of the corresponding conductive pillar.

According to an embodiment of the invention, the step of forming the corresponding dielectric pillar in each of the second holes is as follows. A dielectric material layer is formed on the substrate. The dielectric material layer is filled in the second holes. Then, the top surfaces of the gate pillar structures and the stack structures are exposed by performing a planarization process to the dielectric material layer.

According to an embodiment of the invention, each of the stack structures includes a plurality of insulating layers and a plurality of conductive layers. The insulating layers and the conductive layers are stacked alternately along the third direction.

According to an embodiment of the invention, a material of the insulating layers includes silicon oxide, silicon nitride, and a combination thereof. A material of the conductive layers includes doped polysilicon, undoped polysilicon, or a combination thereof.

According to an embodiment of the invention, the third direction is perpendicular to the first direction and the second direction, and the first direction is perpendicular to the second direction.

According to an embodiment of the invention, a material of the word lines includes polysilicon, metal silicide, metal, or a combination thereof.

The invention also provides a method for fabricating a memory device, including steps as follows. A stack layer is formed a on a substrate. A plurality of gate pillar structures and a plurality of dielectric pillars are embedded in the stack layer. The plurality of gate pillar structures and the plurality of dielectric pillars extend along a same direction and are alternately arranged, so that the stack layer is divided into a plurality of stack structures.

According to an embodiment of the invention, the step of embedding the plurality of gate pillar structures and the plurality of dielectric pillars in the stack layer includes steps as follows. A plurality of first holes are formed in the stack layer. The gate pillar structures are formed in the first holes. A plurality of second holes are formed in the stack layer, and the second holes and the gate pillar structures are arranged alternately. The dielectric pillars are formed in the second holes.

According to an embodiment of the invention, the step of forming the gate pillar structures in the first holes includes steps as follows. A charge storage layer is formed in each of the first holes. A conductive pillar is formed on the charge storage layer in each of the first holes.

According to an embodiment of the invention, the stack layer includes a plurality of insulating layers and a plurality of conductive layers, and the insulating layers and the conductive layers are stacked alternately.

Based on the above, the plurality of gate pillar structures and the plurality of dielectric pillars are embedded in the stack layer by performing separate etching and deposition processes, such that the stack layer is divided into the plurality of stack structures (serving as bit lines, for example) in the second regions. In this way, the memory device and the method for fabricating the same may avoid the issue of bit line channel bending and word line bridging, thereby improving product reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
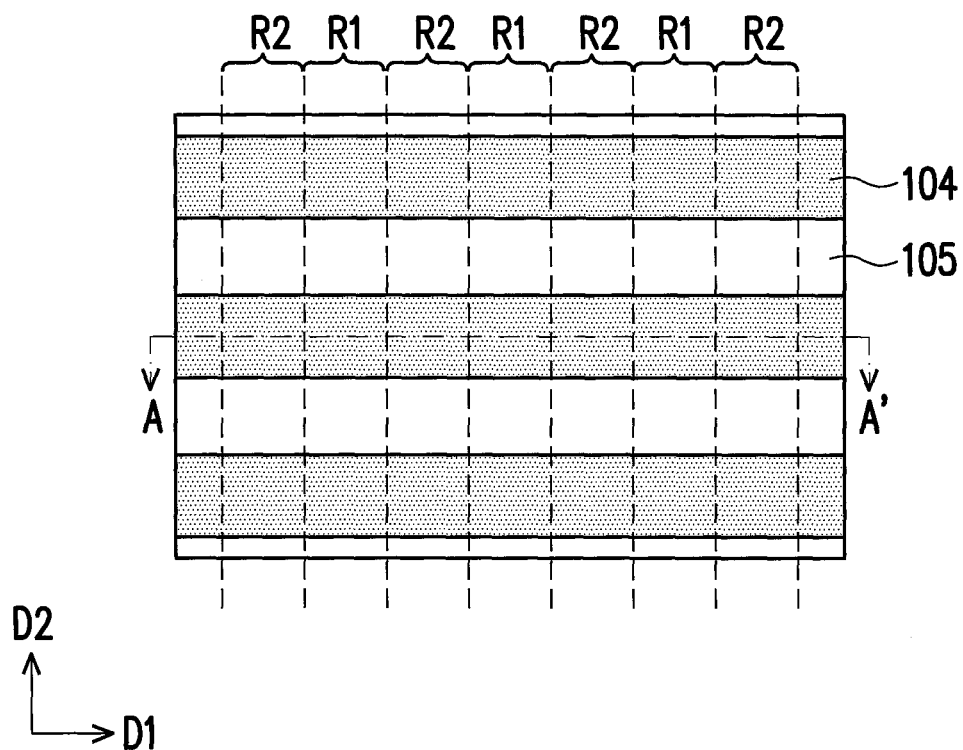
FIGS. 1A to 1E are top schematic view illustrating a method for fabricating a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are top schematic view illustrating a method for fabricating a memory device according to an embodiment of the invention. FIGS. 2A to 2E are cross-sectional schematic views along an A-A' line in FIGS. 1A to 1E.

Figure 2A:
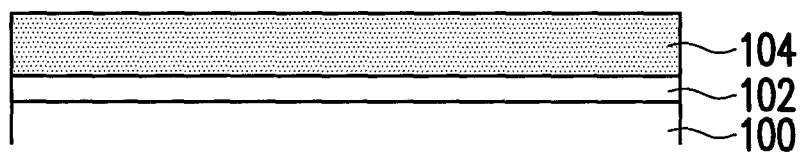
FIGS. 2A to 2E are cross-sectional schematic views along an A-A' line in FIGS. 1A to 1E.

Referring to FIGS. 1A and 2A together, a substrate 100 is a semiconductor substrate, a semiconductor compound substrate, or a semiconductor over insulator (SOI) substrate, for example. The semiconductor is atoms of IVA Group, for example, such as silicon or germanium. The semiconductor compound is a semiconductor compound formed of atoms of IVA group, for example, such as silicon carbide or silicon germanium, or atoms of IIIA Group and VA Group, such as gallium arsenide. The substrate 100 has a plurality of first regions R1 and a plurality of second regions R2. The first regions R1 and the second regions R2 extend along a second direction D2 and are arranged alternately along a first direction D1. The second direction D2 and the first direction D1 are different. In an embodiment, the first direction D1 and the second direction D2 are substantially perpendicular to each other.

Then, a plurality of word lines 104 are formed on the substrate 100. Each of the word lines 104 extends along the first direction D1 and crosses the first regions R1 and the second regions R2. Specifically, a word line material layer (not shown) is sequentially formed on the substrate 100. Then, a photolithography process and an etching process are performed to the word line material layer, so as to form the plurality of word lines 104 on the substrate 100. The etching process may be a dry etching process, for example, and the dry etching process may be a reactive ion etching (RIB) process, for example. A material of the word lines 104 may include polysilicon, metal silicide, metal, or a combination thereof, and a method of forming the word lines 104 may be the chemical vapor deposition method. The metal silicide may be tungsten silicide or cobalt silicide, nickel silicide, titanium silicide, copper silicide, molybdenum silicide, tantalum silicide, erbium silicide, zirconium silicide, or platinum silicide, for example.

Then, an isolation structure 105 is formed between two adjacent word lines 104. Each of the isolation structures 105 extends along the first direction D1 and crosses the first regions R1 and the second regions R2. Specifically, the isolation structure material layer (not shown) is formed on the substrate 100, and then an etching back process is performed to the isolation structure material layer so as to form the isolation structures 105 between two adjacent word lines 104. The isolation structure 105 is disposed between two adjacent word lines 104, such that the word lines 104 are electrically isolated from each other. A material of the isolation structures 105 includes silicon oxide or a low dielectric constant material having a dielectric constant lower than 4, and a method of forming the isolation structures 105 may be the chemical vapor deposition method.

Figure 1B:
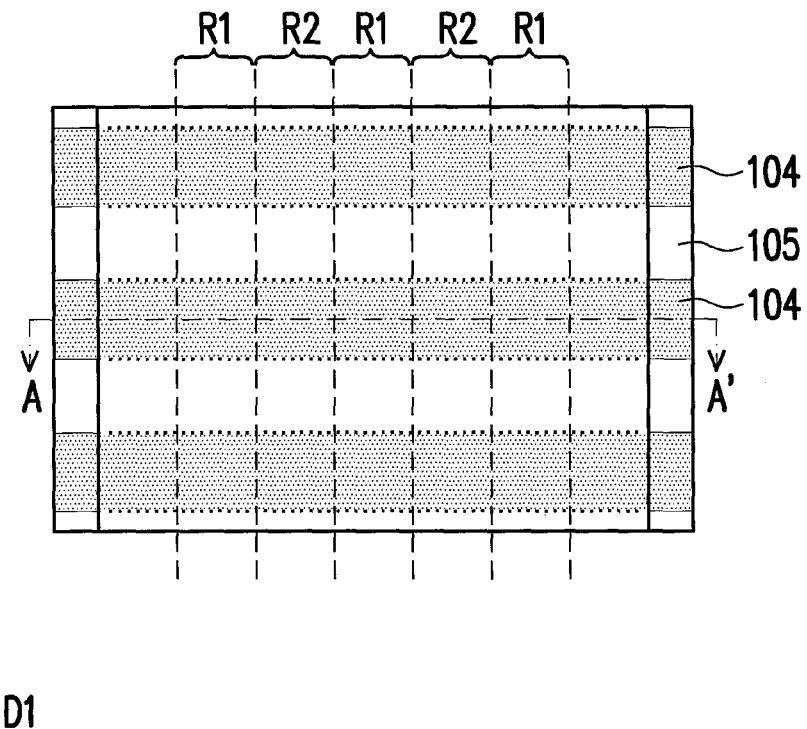
Figure 2B:
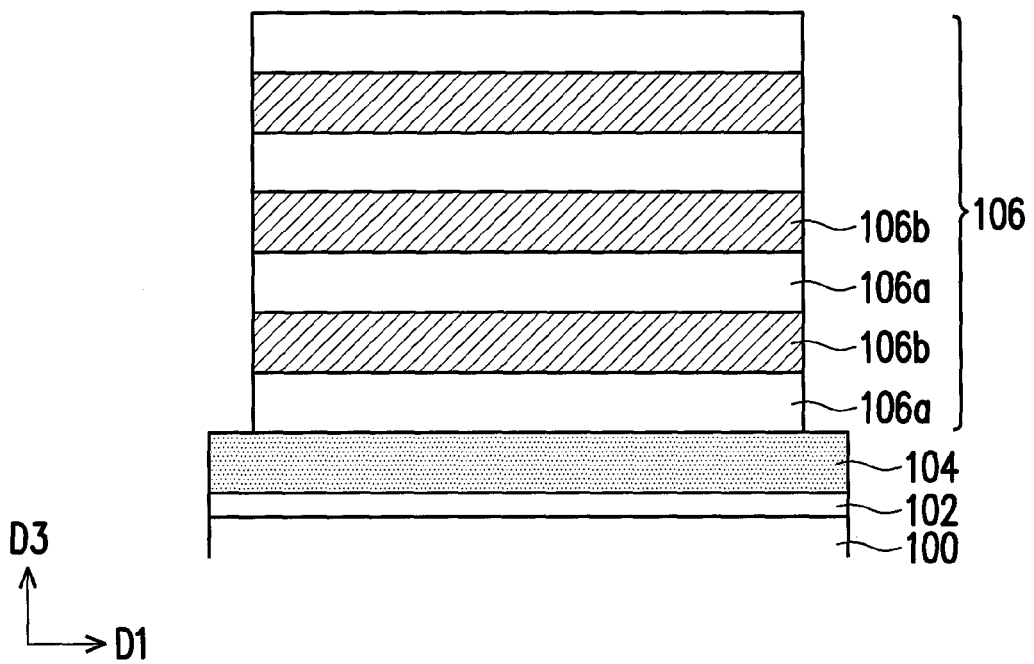

Referring to FIGS. 1B and 2B together, a stack layer 106 is formed on the substrate 100. The stack layer 106 includes a plurality of insulating layers 106a and a plurality of conductive layers 106b, and the insulating layers 106a and the conductive layers 106b are stacked alternately along a third direction D3. The third direction D3 is different from the first direction D1 and the second direction D2. In an embodiment, the third direction D3 is substantially perpendicular to the first direction D1 and the second direction D2, and the first direction D1 is substantially perpendicular to the second direction D2.

In an embodiment, the number of layers of the conductive layers 106b may be 8, 16, 32, or more. Similarly, the insulating layer 106a is disposed between two adjacent conductive layers 160b, so the number of layers of the insulating layers 106a may be 8, 16, 32, or more. In an embodiment, a material of the insulating layers 106a may include silicon oxide, silicon nitride, or a combination thereof, and a method of forming the insulating layers 106a may be the chemical vapor deposition method. A material of the conductive layers 106b may be doped polysilicon, undoped polysilicon, or a combination thereof, and a method of forming the conductive layers 106b may be the chemical vapor deposition method.

Figure 1C:
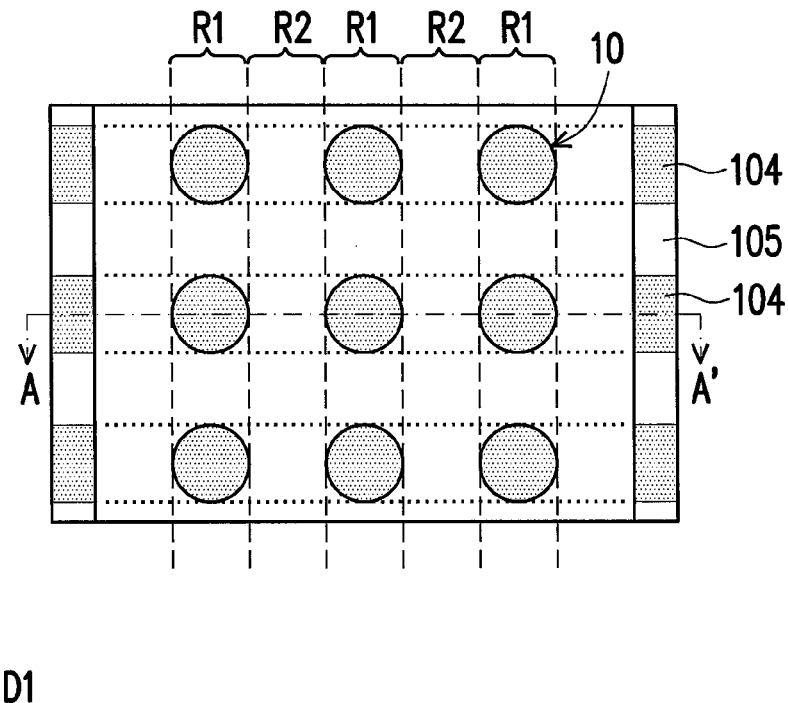
Figure 2C:
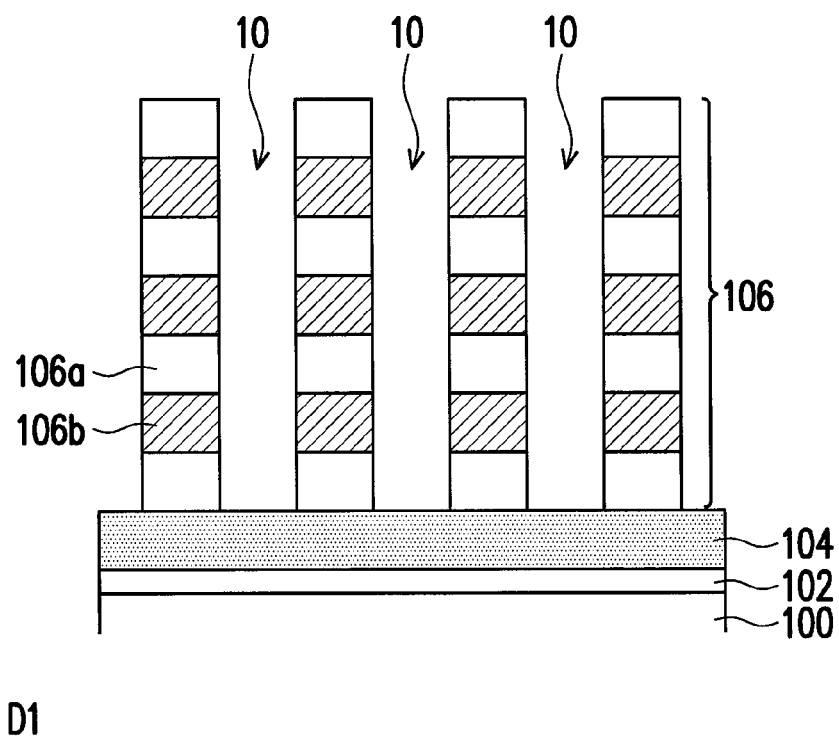

Referring to FIGS. 1C and 2C together, a photolithography process and an etching process are performed to the stack layer 106, so as to form a plurality of first holes 10 in the stack layer 106 on the word lines 104 in the first regions R1. The first holes 10 extend along the third direction D3, and expose the word lines 104 in the first regions R1. In an embodiment, a shape of the first holes 10 may be circular, square, rectangular, or an arbitrary shape, for example, as long as the first holes 10 penetrate the stack layer 106 to the word lines 104 after the photolithography process and the etching process. A size of each of the first holes 10 may be greater or equal to a width of the corresponding word line 104, as long as the first hole 10 is not connected to another first hole 10. The etching process may be a dry etching process, for example, and the dry etching process may be a reactive ion etching (RIE) process, for example.

Figure 1D:
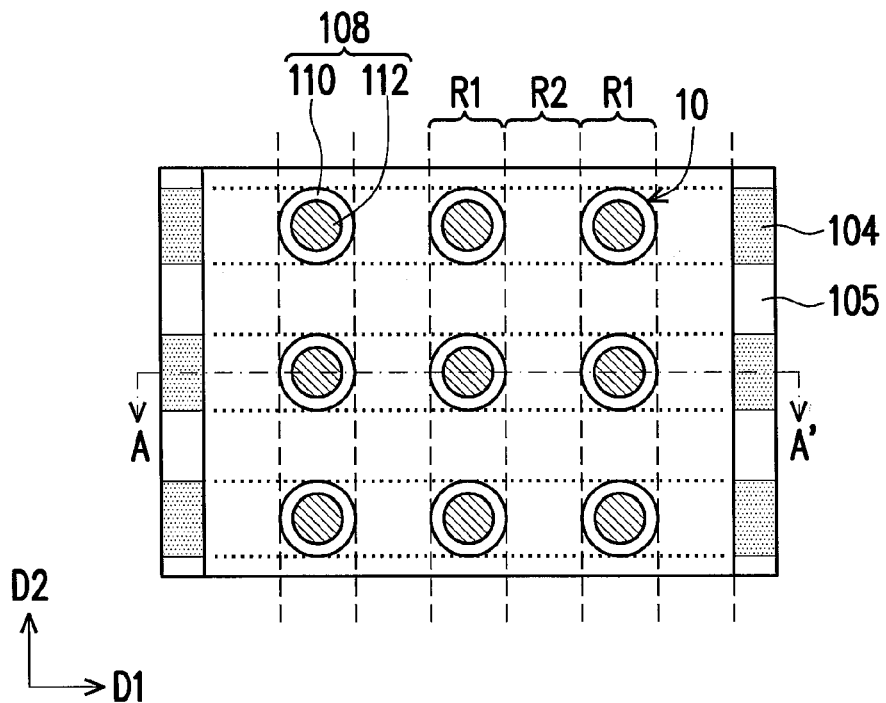
Figure 2D:
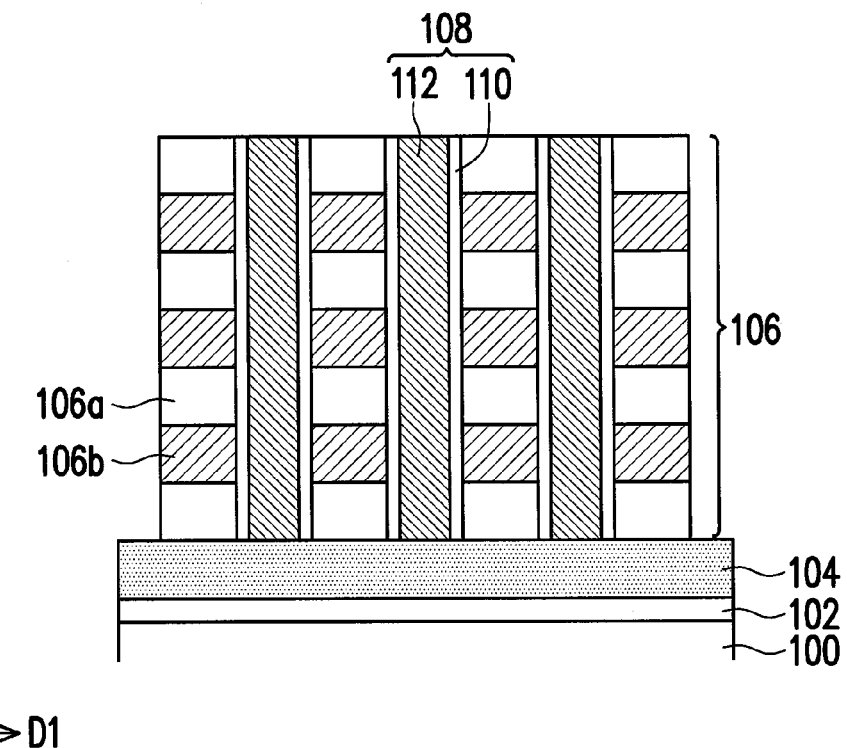

Referring to FIGS. 1D and 2D together, a gate pillar structure 108 is formed in each of the first holes 10. Each of the gate pillar structures 108 extends along the third direction D3, and each of the gate pillar structures 108 includes a charge storage layer 110 and a conductive pillar 112 (serving as a control gate, for example). A bottom of each of the conductive pillars 112 is electrically connected with the corresponding word line 104. Therefore, each of the conductive pillars 112 may serve as an extension of the corresponding word line 104 and function as the word line. Each of the charge storage layers 110 is located at a periphery of the corresponding conductive pillar 112, such that the corresponding plurality of conductive layers 106b in the stack layer 106 is electrically isolated from the conductive pillar 112. Specifically, steps of forming the corresponding gate pillar structure 108 in each of the first holes 10 are described as follows. First of all, a charge storage material layer (not shown) is formed on the substrate 100. The charge storage material layer covers a top surface of the stack layer 106, a sidewall of the first hole 10, and a top surface of the word line 104. Then, a conductive material layer is formed on the charge storage material layer. Subsequently, a part of the charge storage material layer and a part of the conductive material layer are removed to expose the top surfaces of the stack layer 106 and the word line 104 by performing a chemical-mechanical polishing (CMP) process or an anisotropic etching process, such that the charge storage layer 110 and the conductive pillar 112 are formed on the sidewall of each of the first holes 10. In an embodiment, a material of the charge storage material layer may include an oxide layer, a nitride layer, or a composite layer of an arbitrary combination thereof. The composite layer may include three or more layers, and the invention is not limited thereto. A method of forming the charge storage material layer may be the chemical vapor deposition method, the thermal oxidation method, etc. For example, the charge storage material layer may include a composite layer such as an oxide/nitride/oxide (ONO) layer, an oxide/nitride/oxide/nitride (ONON) layer, etc. In an embodiment, a material of the conductive material layer may include polysilicon, metal silicide, metal, or a combination thereof, and a method of forming the conductive material layer may be the chemical vapour deposition method. The metal silicide may be tungsten silicide or cobalt silicide, nickel silicide, titanium silicide, copper silicide, molybdenum silicide, tantalum silicide, erbium silicide, zirconium silicide, or platinum silicide, for example.

Figure 1E:
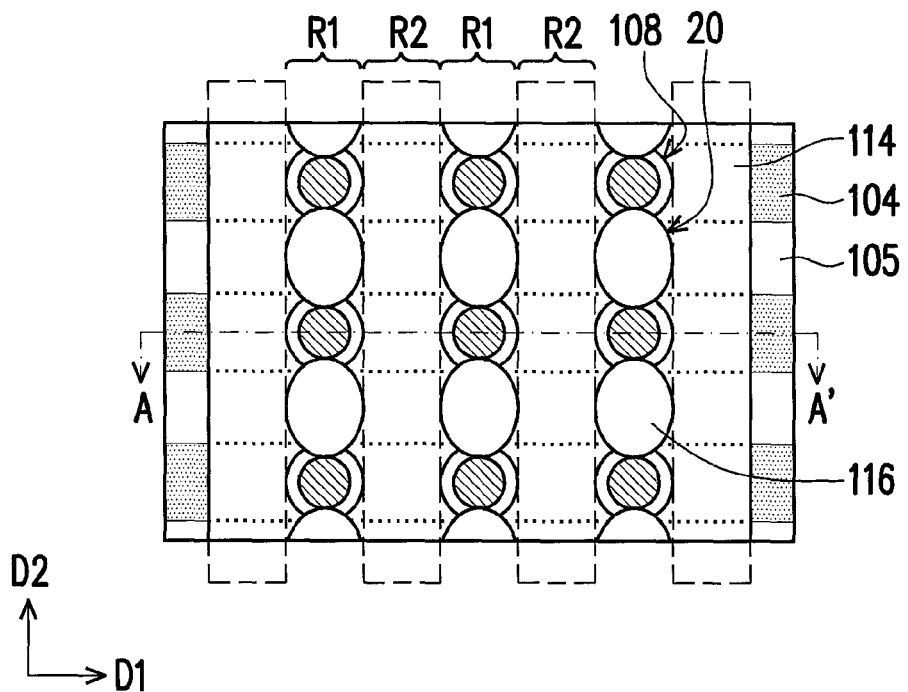
Figure 2E:
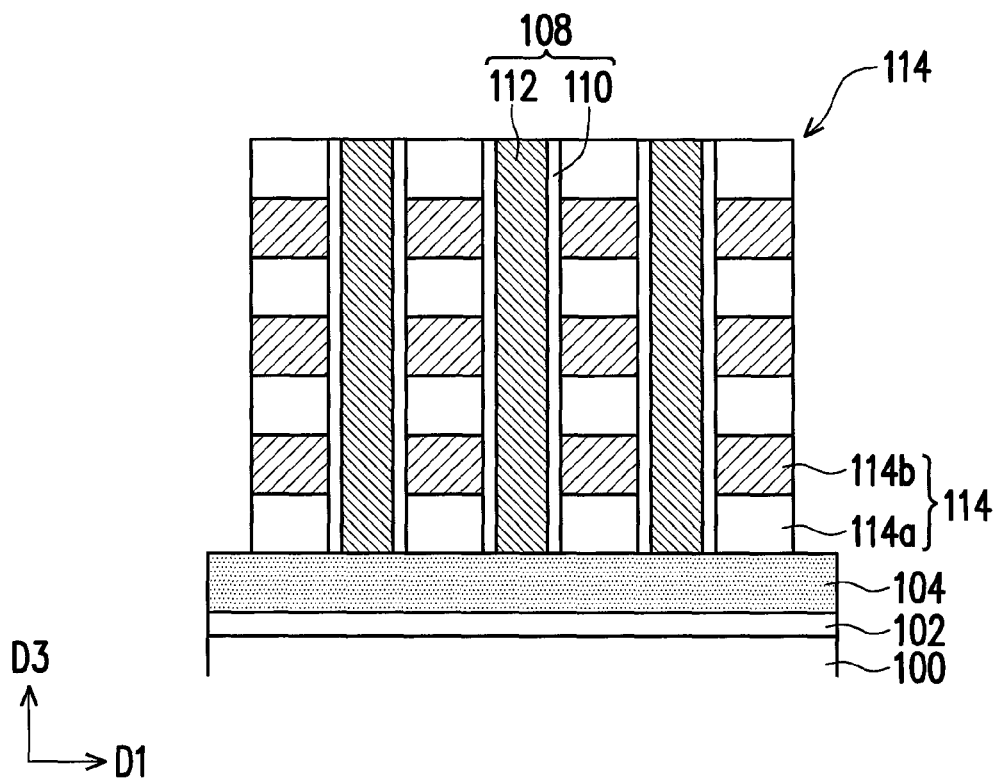

Referring to FIGS. 1E and 2E together, a plurality of dielectric pillars 116 are formed in the stack layer 106 on the isolation structures 105 in the first regions R1. The dielectric pillars 116 extend along the third direction D3, and the dielectric pillars 116 and the gate pillar structures 108 are alternately arranged along the second direction D2 to electrically isolate the gate pillar structures 108 and stack structures 114.

Specifically, first of all, a photolithography process and an etching process are performed to the stack layer 106 to form a plurality of second holes 20 in the stack layer 106 on the isolation structures 105 in the first regions R1. The second holes 20 expose surfaces of the isolation structures 105 and extend along the third direction D3. The second holes 20 and the gate pillar structures 108 are alternately arranged along the second direction D2. A sidewall of each of the second holes 20 exposes the gate pillar structures 108 adjacent thereto. In an embodiment, a shape of the second holes 20 may be circular, square, rectangular, or an arbitrary shape, for example, as long as the second holes 20 penetrate the stack layer 106 to the top surfaces of the isolation structures 105 after the photolithography process and the etching process. A size of each of the second holes 20 may be greater than or equal to the width of the corresponding isolation structure 105, as long as each of the second holes 20 exposes the corresponding gate pillar structures 108. In an embodiment, the etching process may be a dry etching process, for example, and the dry etching process may be a reactive ion etching process, for example.

Then, a dielectric material layer (not shown) is formed on the substrate 100. The dielectric material layer is filled into the second holes 20. A material of the dielectric material layer may include silicon oxide, silicon nitride, or a combination thereof, and a method of forming the dielectric material layer may be the chemical vapor deposition method. Subsequently, a planarization process is performed to the dielectric material layer to expose the top surfaces of the gate pillar structures 108 and the stack structures 114, such that a plurality of the dielectric pillars 116 are formed in the second holes 20. In an embodiment, the planarization process may be a chemical-mechanical polishing (CMP) process.

In other words, by embedding the dielectric pillars 116 and the gate pillar structures 108 into the stack layer 106 in the first regions R1, the stack layers 106 may be divided into the plurality of stack structures 114. The stack structures 114 extend along the second direction D2 and are located between the dielectric pillars 116 and the gate pillar structures 108 in two adjacent first regions R1. In addition, the stack structures 114 traverse the plurality of word lines 104 and the plurality of isolation structures 105. When any of the dielectric pillars 116 and the gate pillar structures 108 are not in the rectangular shape and are different in size, the sidewalls of the stack structures 114 are not flat surfaces. A shape of the sidewalls thereof includes a sawtoothed shape, or a serpentine shape.

Referring to FIGS. 1E and 2E together, the memory device of this embodiment of the invention includes the substrate 100, the plurality of word lines 104, the plurality of isolation structures 105, the plurality of gate pillar structures 108, the plurality of stack structures 114 (serving as a plurality of bit lines, for example), and the plurality of dielectric pillars 116.

The substrate 100 has the plurality of first regions R1 and plurality of second regions R2. The first regions R1 and the second regions R2 are alternately arranged along the first direction D1. The plurality of word lines 104 are located on the substrate 100. Each of the word lines 104 extends along the first direction D1 and crosses the first and second regions R1 and R2. The plurality of isolation structures 105 are located on the substrate 100 and between two adjacent word lines 104. Each of the isolation structures 105 extends along the first direction D1, and crosses the first and second regions R1 and R2. Each of the stack structures 114 extends along the second direction D2, and crosses the word lines 104 and the isolation structures 105 in the second regions R2. Each of the stack structures 114 includes the plurality of insulating layers 114a and the plurality of conductive layers 114b. The insulating layers 114a and the conductive layers 114b are stacked alternately along the third direction D3, as shown in FIG. 2E.

The plurality of gate pillar structures 108 are located in the first regions R1. Each of the gate pillar structures 108 extends along the third direction D3. Each of the gate pillar structures 108 includes the charge storage layer 110 and the conductive pillar 112 (serving as a control gate, for example). The bottom of each of the conductive pillars 112 is electrically connected with the corresponding word line 104. Each of the charge storage layer 110 is located at a periphery of the corresponding conductive pillar 112 to electrically isolate the corresponding stack structure 114 and the conductive pillar 112. The first direction D1 is different from the second direction D2, and is different from the third direction D3. In an embodiment, the third direction D3 is substantially perpendicular to the first direction D1 and the second direction D2, and the first direction D1 is substantially perpendicular to the second direction D2. The plurality of dielectric pillars 116 are located on the isolation structures 105 in the first regions R1. The dielectric pillars 116 extend along the third direction D3, and the dielectric pillars 116 and the gate pillar structures 108 are arranged alternately along the second direction D2 to electrically isolate the gate pillar structures 108 and the stack structures 114.

As shown in FIGS. 1E and 2E, since the conductive pillars 112 may serve as the extensions of the word lines 104, and each of the stack structures 114 (serving as bit lines, for example) is located between two adjacent conductive pillars 112 (serving as control gates, for example), the word lines 104 may control an operation of the memory device of the invention by using the gate pillar structures 108 at two side surfaces of the stack structures 114 as a dual gate structure. Compared with single-side control, dual-side control of the memory device of the invention using the two side surfaces of the stack structures 114 makes the operation of the memory device more accurate.

In view of the foregoing, in the invention, the plurality of gate pillar structures and the plurality of dielectric pillars are embedded in the stack layer by performing separate etching and deposition processes, such that the stack layer is divided into the plurality of stack structures (serving as bit lines, for example). The plurality of gate pillar structures and the plurality of dielectric pillars are formed by separately performing the etching processes for forming holes in the stack layer and refilling material layers in the holes. Therefore, after the first holes are formed in the stack layer, the portions of the remained stack layer between two adjacent first holes still provide support in the first direction and the second direction. In addition, when the second holes are formed in the stack layer, the gate pillar structures still provide support in the first direction. In addition, the dielectric pillars are capable of electrically isolating the gate pillar structures and the stack structures. In this way, the memory device and the method for fabricating the same according to the embodiments of the invention are capable of avoiding the issue that a high aspect ratio of the stack structures causes bending of bit line channels and bridging of the word lines, thereby improving product reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
   a plurality of gate pillar structures and a plurality of dielectric pillars extending along a same direction, arranged alternately, and embedded in a stack layer so that the stack layer is divided into a plurality of stack structures,
   a substrate, having a plurality of first regions and a plurality of second regions, wherein the first regions and the second regions are arranged alternately along a first direction; and
   a plurality of word lines, located on the substrate, wherein each of the word lines extends along the first direction and crosses the first regions and the second regions.

2. The memory device as claimed in claim 1, further comprising:
   a plurality of isolation structures, located on the substrate and between two adjacent word lines, wherein each of the isolation structures extends along the first direction and crosses the first regions and the second regions;
   the plurality of stack structures, located on the word lines and the isolation structures in the second regions, wherein each of the stack structures extends along a second direction and crosses the word lines and the isolation structures;

the plurality of gate pillar structures, located in the first regions, wherein each of the gate pillar structures extends along a third direction, and each of the gate pillar structures comprises:
- a conductive pillar, wherein a bottom of each of the conductive pillars is electrically connected with the corresponding word line; and
- a charge storage layer, wherein each of the charge storage layers is located at a periphery of the corresponding conductive pillar to electrically isolate the corresponding stack structure and conductive pillar, the first direction is different from the second direction, and the first direction is different from the third direction; and the plurality of dielectric pillars, located on the isolation structures in the first regions, wherein the dielectric pillars extend along the third direction, and the dielectric pillars and the gate pillar structures are alternately arranged along the second direction to electrically isolate the gate pillar structures and the stack structures.

3. The memory device as claimed in claim 2, wherein a shape of sidewalls of the gate pillar structures in two adjacent first regions and the stack structure in the second region between the dielectric pillars comprises a sawtoothed shape, or a serpentine shape.

4. The memory device as claimed in claim 2, wherein the third direction is substantially perpendicular to the first direction and the second direction, and the first direction is perpendicular to the second direction.

5. The memory device as claimed in claim 4, wherein each of the stack structures comprises a plurality of insulating layers and a plurality of conductive layers, and the insulating layers and the conductive layers are stacked alternately along the third direction.

6. The memory device as claimed in claim 5, wherein a material of the insulating layers comprises silicon oxide, silicon nitride, or a combination thereof; and a material of the conductive layers comprises doped polysilicon, undoped polysilicon, or a combination thereof.

7. The memory device as claimed in claim 2, wherein each of the charge storage layers comprises an oxide layer, a nitride layer, or a composite layer of an arbitrary combination thereof.

8. The memory device as claimed in claim 2, wherein a material of the word lines comprises polysilicon, metal silicide, metal, or a combination thereof.

9. The memory device as claimed in claim 2, wherein the gate pillar structures at two sides of each of the stack structures forms a dual gate structure.

* * * * *